United States Patent
Sugawa et al.

(10) Patent No.: US 9,420,210 B2
(45) Date of Patent: Aug. 16, 2016

(54) SOLID-STATE IMAGE SENSOR FOR CAPTURING HIGH-SPEED PHENOMENA AND DRIVE METHOD FOR THE SAME

(75) Inventors: Shigetoshi Sugawa, Sendai (JP); Yasushi Kondo, Kyoto (JP); Hideki Tominaga, Uji (JP)

(73) Assignees: TOHOKU UNIVERSITY, Miyagi (JP); SHIMADZU CORPORATION, Kyoto (JP)

( * ) Notice: Subject to any disclaimer, the term of this patent is extended or adjusted under 35 U.S.C. 154(b) by 346 days.

(21) Appl. No.: 12/996,969

(22) PCT Filed: Jun. 10, 2009

(86) PCT No.: PCT/JP2009/002605
§ 371 (c)(1),
(2), (4) Date: Dec. 8, 2010

(87) PCT Pub. No.: WO2009/150829
PCT Pub. Date: Dec. 17, 2009

(65) Prior Publication Data
US 2011/0085066 A1 Apr. 14, 2011

(30) Foreign Application Priority Data
Jun. 10, 2008 (JP) ................................. 2008-151162

(51) Int. Cl.
*H04N 5/235* (2006.01)
*H04N 5/378* (2011.01)
(Continued)

(52) U.S. Cl.
CPC ........... *H04N 5/378* (2013.01); *H04N 5/37452* (2013.01); *H01L 27/14843* (2013.01); *H04N 5/3575* (2013.01)

(58) Field of Classification Search
CPC .............. H04N 1/40; H04N 19/00478; H04N 19/00484; H01L 27/14837; H01L 27/1485
USPC ................................. 348/294–324
See application file for complete search history.

(56) References Cited

U.S. PATENT DOCUMENTS 6,972,795 B1 12/2005 Etoh et al. ...................... 348/311
2001/0009440 A1* 7/2001 Yang et al. ...................... 348/294
(Continued)

FOREIGN PATENT DOCUMENTS

JP 05-336420 12/1993
JP 2000-165750 6/2000
(Continued)

OTHER PUBLICATIONS

Japanese language international preliminary report on patentability dated Jan. 11, 2011 and its English language translation for corresponding PCT application PCT/JP2009/002605.
(Continued)

*Primary Examiner* — Twyler Haskins
*Assistant Examiner* — Dwight C Tejano
(74) *Attorney, Agent, or Firm* — Morgan, Lewis & Bockius LLP

(57) ABSTRACT

A burst reading memory section (200) and continuous reading memory section (210) are independently provided for each of the two-dimensionally arrayed pixels (10). The burst reading memory section (200) has capacitors (25001-25104) capable of holding a plurality of signals. The continuous reading memory section (210) has only one capacitor 213. Signal output lines for the two memory sections are separately provided. When a signal produced by photoelectric conversion at the pixel (10) is outputted on a pixel output line (14), the signal can be simultaneously written in the capacitors at both memory sections (200, 201), after which the signals can be separately extracted to the outside at different timings. Therefore, a series of images taken at extremely short intervals of time during a short period of time can be obtained at an arbitrary timing without impeding a continuous image-acquiring operation at a low frame rate. Accordingly, both an ultrahigh-speed imaging operation having a limitation on the number of frames and an imaging that is rather slow but has no limitation on the number of frames can be simultaneously performed.

10 Claims, 10 Drawing Sheets

(51) Int. Cl.
*H04N 5/3745* (2011.01)
*H01L 27/148* (2006.01)
*H04N 5/357* (2011.01)

(56) References Cited

U.S. PATENT DOCUMENTS

| | | | |
|---|---|---|---|
| 2003/0038888 A1* | 2/2003 | Flynn | 348/311 |
| 2005/0206757 A1* | 9/2005 | Itoh | 348/294 |
| 2006/0103748 A1* | 5/2006 | Mabuchi | 348/308 |
| 2007/0222877 A1* | 9/2007 | Kurane | 348/294 |
| 2007/0291149 A1* | 12/2007 | Kondo et al. | 348/311 |
| 2009/0021630 A1* | 1/2009 | Hasegawa | 348/311 |
| 2010/0013973 A1* | 1/2010 | Adkisson et al. | 348/308 |
| 2010/0188538 A1* | 7/2010 | Sugawa et al. | 348/294 |

FOREIGN PATENT DOCUMENTS

| | | |
|---|---|---|
| JP | 2001-345441 | 12/2001 |
| JP | 2004-336108 | 11/2004 |
| JP | 2006-245522 | 9/2006 |

OTHER PUBLICATIONS

Yasushi Kondo et al., "Development of "Hyper-Vision HPV-1" High Speed Video Camera", Shimadzu Review, Sep. 30, 2005, vol. 62, No. 1-2, pp. 79-86.

Extended European search report dated Nov. 16, 2012 issued in corresponding European application 09762260.9.

Taiwan Office Action dated Jan. 23, 2014 for corresponding Taiwan Patent Application No. 98119310, and the English translation of "Reason for Rejection".

* cited by examiner

Fig. 5
(a) CONTINUOUS READING MODE (ONE FRAME ONLY)
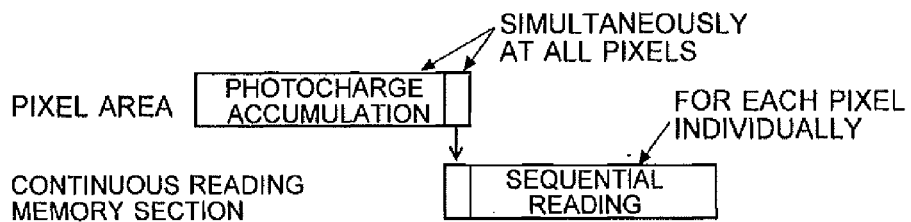
(b) CONTINUOUS READING MODE (REPEATED)
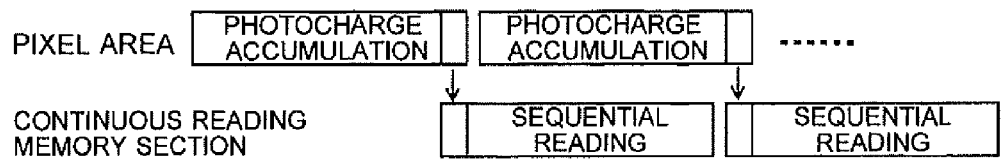
(c) BURST READING MODE
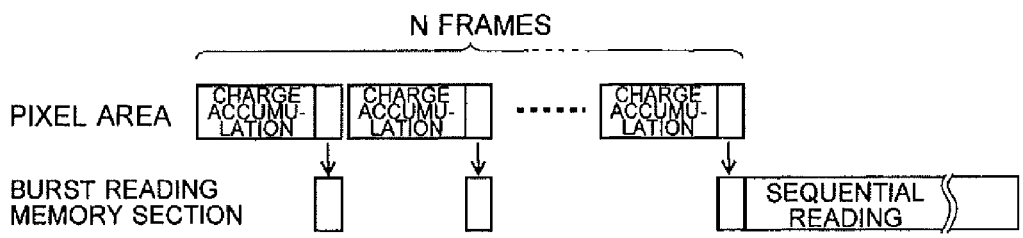
(d) CONCURRENT CONTINOUS/BURST READING MODE
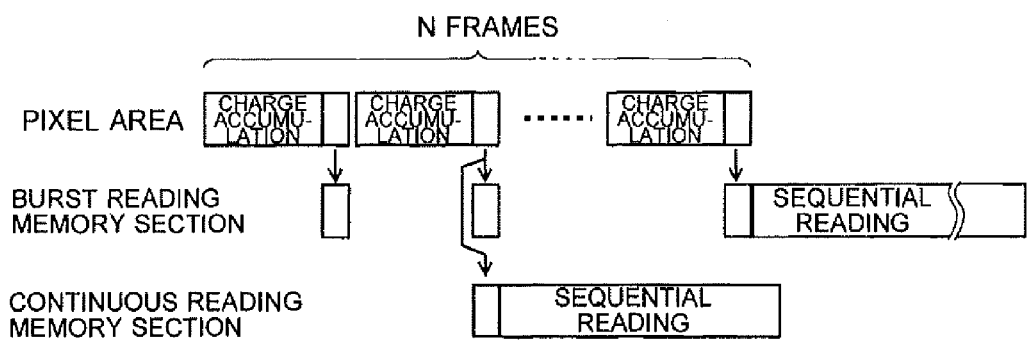

SOLID-STATE IMAGE SENSOR FOR CAPTURING HIGH-SPEED PHENOMENA AND DRIVE METHOD FOR THE SAME

CROSS-REFERENCE TO THE RELATED APPLICATIONS

This application is a national stage of international application No. PCT/JP2009/002605, filed on Jun. 10, 2009, and claims the benefit of priority under 35 USC 119 to Japanese Patent Application No. 2008-151162, filed on Jun. 10, 2008, the entire contents of which are incorporated herein by reference.

TECHNICAL FIELD

The present invention relates to a solid-state image sensor and a drive method for this sensor. More specifically, it relates to a solid-state image sensor capable of high-speed operations suitable for taking images of high-speed phenomena, such as destructions, explosions or combustions, and a drive method for such a sensor.

BACKGROUND ART

High-speed imaging devices (high-speed video cameras) used for taking consecutive images of high-speed phenomena, such as explosions, destructions, combustions, collisions or discharges, for only a short period of time have been conventionally developed (for example, refer to Non-Patent Document 1 and other documents). Such high-speed imaging devices need to perform an ultrahigh-speed imaging operation that exceeds a level of approximately one million frames per second. Accordingly, they use solid-state image sensors capable of high-speed operations, which have special structures different from those of the conventional imaging sensors used in normal video cameras, digital cameras and similar devices.

One example of this type of solid-state image sensor is disclosed in Patent Document 1 and other documents. The devices disclosed in those documents are referred to as an "in-situ storage image sensor" (IS-CCD). An outline of this image sensor is as follows.

In this in-situ storage image sensor, a storage CCD for holding a specified number of record frames is provided for each photodiode functioning as a photo-receiver. This CCD is also used for transferring signals. During an imaging operation, pixel signals produced by photoelectric conversion by the photodiode are sequentially transferred to the storage CCD. After the imaging operation is completed, the pixel signals corresponding to the specified number of record frames stored in the storage CCD are collectively and sequentially read, and the images corresponding to the specified number of record frames are reproduced outside the image sensor. During the imaging operation, pixel signals exceeding the specified number of image frames are discarded from the oldest ones. Thus, the latest set of pixel signals corresponding to the specified number of frames are always held in the storage CCD. This means that, when the transfer of pixel signals to the storage CCD is suspended at the completion of the imaging operation, one can obtain the latest series of images ranging from the completion of the imaging operation back through a period of time corresponding to the specified number of record frames.

Thus, unlike general types of image sensors that require pixel signals to be extracted every time a set of pixel signals corresponding to one frame is obtained, the in-situ storage image sensor is characterized by its capability of acquiring a series of images at extremely high speeds over a plurality of frames. However, the number of storage CCDs that can be mounted on a single sensor is limited due to various factors, such as the limited area of a semiconductor chip and the restriction on power consumption. Accordingly, the number of frames available for the aforementioned high-speed imaging is limited. For example, the number of frames is approximately 100 in the case of the device disclosed in Non-Patent Document 1. This number of frames may suffice for some applications. However, for some types of phenomena or objects, the imaging operation does not require a very high speed (e.g. one million frames per second) but should desirably be continued for a longer period of time or over a larger number of frames. It is difficult for the aforementioned in-situ storage image sensor to meet the demands for such imaging.

Therefore, to support both an ultrahigh-speed imaging mode that has a limitation on the number of consecutive record frames and an imaging mode that is rather slow but has no limitation on the number of record frames, it is necessary to use both the previously described in-situ storage image sensor using CCDs and a commonly known image sensor, such as a CMOS image sensor. Such an imaging system will be expensive.

In the aforementioned high-speed imaging, it is important to perform the imaging in synchronization with the timing of the occurrence of a phenomenon under observation. This is achieved by a control process in which the imaging action is initiated or discontinued in response to an externally given trigger signal. To generate this trigger signal, the system normally includes another sensor, such as a contact sensor, position sensor, shock sensor or pressure sensor. However, in some situations, it is often difficult to obtain appropriate trigger signals by this method, as in the case where the sensor cannot be easily placed close to the object, where the imaging action must capture a spontaneous change in the object under observation, or where the target of imaging is a micro-sized object under a microscope.

To address these problems, an imaging system disclosed in Patent Document 2 uses a light-splitting means, such as a beam splitter or half mirror, provided behind an imaging lens. The light-splitting means separates incident light into two beams, which are respectively introduced into different imaging devices. One of these two imaging devices is dedicated to a monitoring function to detect a sudden change in the image. This imaging device generates a trigger signal, which is used to control the initiation and discontinuation of the storage of image signals produced by the other imaging device. This type of conventional imaging system requires optical parts to split incident light coming from the object of imaging into plural beams, and additionally needs more than one imaging devices (image sensors). Thus, the system will be large and complex, making it difficult to reduce the production cost. Decreasing the size and weight of the system is also difficult.

PRIOR ART DOCUMENTS

Patent Documents

Patent Document 1: Japanese Unexamined Patent Application Publication No. 2001-345441
Patent Document 2: Japanese Unexamined Patent Application Publication No. H05-336420

Non-Patent Document

Non-Patent Document 1: Kondo et al., "Kousokudo Bideo Kamera HyperVision HPV-1 no Kaihatsu (Development of "HyperVision HPV-1" High-Speed Video Camera)", *Shimadzu Hyouron* (*Shimadzu Review*), Shimadzu Hyouron Henshuu-bu, Sep. 30, 2005, Vol. 62, No. 1/2, pp. 79-86

DISCLOSURE OF THE INVENTION

Problem to be Solved by the Invention

The present invention has been developed in view of the previously described problems. Its first objective is to provide a solid-state image sensor capable of concurrently performing both an ultrahigh-speed imaging operation that has a limitation on the number of record frames and another imaging operation that is rather slow but has no limitation on the number of record frames, and a method for driving this image sensor.

The second objective of the present invention is to provide a solid-state image sensor capable of capturing a change in an object or an occurrence of a phenomenon to be observed in an image obtained during an imaging operation over a certain length of time and taking images of such a change or phenomenon at high speeds, and a method for driving this image sensor.

Means for Solving the Problems

A solid-state image sensor according to the present invention aimed at solving the aforementioned problems includes:
  a) a pixel area in which a plurality of pixels each including a photoelectric conversion section for receiving light and producing photocharges are arranged in a two-dimensional array; and
  b) a memory area, which is an area separated from the pixel area and in which a burst reading memory section and a continuous reading memory section are arranged for each pixel, the burst reading memory sections including a plurality of memory sections for each pixel so that output signals of one pixel in the pixel area can be held for a plurality of frames without being read to the outside, and the continuous reading memory section including each one memory section for each pixel separately from the burst reading memory section,
  and an output signal line for reading signals held in the burst reading memory section and an output signal line for reading a signal held in the continuous reading memory section are independently provided.

The solid-state image sensor according to the present invention is a so-called CMOS image sensor using a complementary metal-oxide semiconductor (CMOS).

The photoelectric conversion section provided for each pixel is typically a photodiode. The burst reading memory section and the continuous reading memory section, which are provided in the memory area, may be a combination of a capacitor and a switch (or gate), such as a transistor.

As one variation of the solid-state image sensor according to the present invention, each pixel may include, besides the photoelectric conversion section:
  a transfer element for transferring photocharges produced in the photoelectric conversion section to a detection node for converting an electric-charge signal to a voltage signal;
  a buffer element for sending an output signal from the detection node to a pixel output line; and
  a reset element for resetting at least the photoelectric conversion section and the detection node.

For example, the detection node is a floating diffusion, the transfer element and the reset element are transistors (MOS transistors), and the buffer element is a source follower amplifier composed of a plurality of transistors.

The solid-state image sensor according to the present invention includes a plurality of memory section in the burst reading memory section provided for each pixel. Accordingly, in the process of sequentially taking images for a plurality of frames, it is possible to sequentially write one set of pixel signals after another for each frame to the plurality of memory sections of the burst reading memory sections. During this process, it is unnecessary to read those signals to the outside. In reading signals from a normal type of solid-state image sensor, a considerable length of time is required for sequentially reading an enormous number of signals (which equals the pixel number), and this limits the imaging rate. On the other hand, the solid-state image sensor according to the present invention is capable of continuously performing an imaging operation without reading signals to the outside. Since transferring signals from each pixel to one memory section can be completed in an extremely short period of time, the time required for the imaging of one frame is essentially determined by the time required to accumulate photocharges, which are produced by the photoelectric conversion section upon receiving light, in the detection node or other elements. Therefore, the present image sensor can take images at much higher rates than normal image sensors.

It should be noted that, in the present case, the number of image frames that can be read to the outside depends on the number of memory sections provided in burst reading memory sections per one pixel. For example, if 100 memory sections of the burst reading memory sections are provided per one pixel, it is possible to obtain up to 100 frames of images in series.

On the other hand, the continuous reading memory sections are provided for the pixels on a one-to-one basis. Therefore, the pixel signals must be read from the continuous reading memory sections every time one frame of image is taken and the obtained signals are transferred from the pixels to the continuous reading memory sections, i.e. every time an imaging process for one frame is completed. The time required for this readout process determines the repetitive rate of imaging, and this rate is difficult to increase. However, this inconvenience is compensated by the fact that the imaging can be continued for a long period of time (theoretically unlimited) at a specific frame rate.

As one variation intended for taking advantage of the previously described characteristics of the present invention, the solid-state image sensor according to the present invention may further include a drive control means for performing:
  a first drive mode, in which an operation of accumulating photocharges in each pixel and an operation of holding a signal read from each pixel in each corresponding continuous reading memory section are performed simultaneously at all the pixels and, subsequently, the signals corresponding to one frame are outputted by sequentially reading the signals held in the continuous reading memory sections; and
  a second drive mode, in which the operation of accumulating photocharges in each pixel and an operation of holding a signal read from each pixel in one of said plurality of memory sections of each corresponding burst reading memory section are performed simultaneously at all the pixels and repeated while changing the memory section to hold the signal read from each pixel from one to another among said plurality of memory sections in each burst reading memory section sequentially, and after the signals corresponding to a plurality of frames are held in the burst reading memory sections, the signals corresponding to the plurality of frames are outputted by sequentially reading signals from the burst reading memory sections.

The drive control means may control the pixels, memory sections and other elements so as to perform the imaging operation in either the first drive mode or the second drive mode. However, the solid-state image sensor according to the present invention is particularly characterized in that the drive control means can concurrently perform both the first drive mode and the second drive mode so as to simultaneously hold each signal read from each pixel in one of said plurality of memory sections of each corresponding burst reading memory section as well as in each corresponding continuous reading memory section.

Furthermore, since the output signal lines for reading signals held in the burst reading memory section and the output signal lines for reading signals held in the continuous reading memory section are independent from each other, the signals that are simultaneously held in these two types of memory sections can be separately read at completely different timings. That is to say, while a long-time imaging operation at a relatively low frame rate is underway, a high-speed imaging operation for a predetermined number of frames can be performed without interrupting the long-time imaging operation.

The drive method for the solid-state image sensor according to the present invention may include operating the solid-state image sensor in the first drive mode, generating a trigger signal upon capturing an occurrence of a phenomenon of interest or a change in an object based on a signal generated by the solid-state image sensor, and changing the drive mode according to the trigger signal so as to concurrently perform the first drive mode and the second drive mode.

By this method, it is possible to take accurate images of a targeted high-speed phenomenon even when the change in an object cannot be captured by a shock sensor or other kinds of sensors or when such a sensor cannot be provided due to physical restrictions. The present imaging method does not require additional imaging devices and hence contributes to the cost reduction of high-speed imaging systems. The repetitive imaging operation at a low frame rate is continued even when the high-speed imaging is performed. Therefore, none of the images obtained by the repetitive imaging operation will be missed.

Effects of the Invention

The solid-state image sensor and its drive method according to the present invention make it possible to concurrently perform both an ultrahigh-speed imaging operation (e.g. at one million frames per second or higher) and a rather slow but long-time repetitive imaging operation by only one image sensor. Thus, one can provide an imaging device that is relatively inexpensive yet widely applicable or highly usable. For example, it is possible to detect the beginning of a change in an object or an occurrence of a phenomenon of interest and perform high-speed imaging of such a change or phenomenon at a correct timing. A temporal zoom function for capturing a phenomenon with a higher temporal resolution during a specific period of time can also be easily realized.

BRIEF DESCRIPTION OF THE DRAWINGS

FIG. 5 is a schematic time chart of the drive modes in the solid-state image sensor of the present embodiment.

BEST MODE FOR CARRYING OUT THE INVENTION

A solid-state image sensor and its drive method, which are an embodiment of the present invention, are hereinafter described with reference to the attached drawings.

Figure 1:
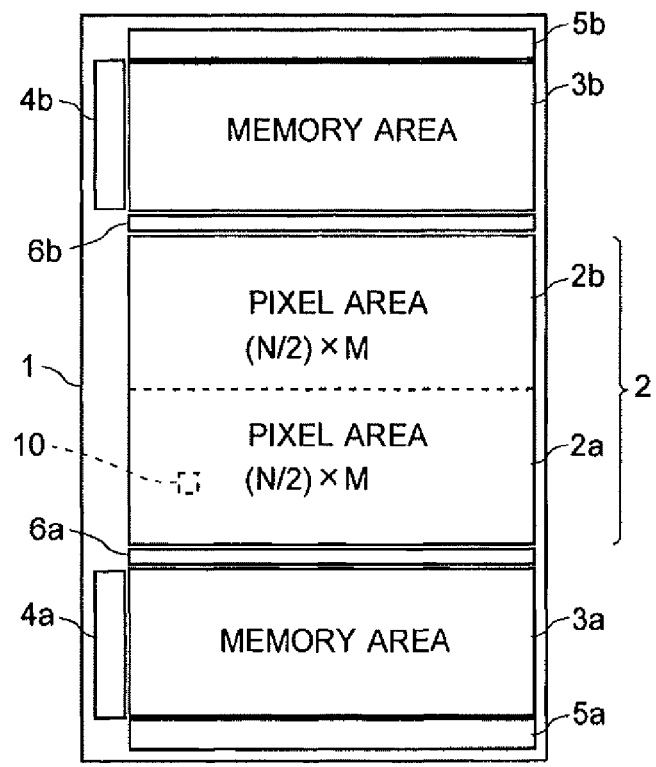
FIG. 1 is a schematic plan view showing the layout on a semiconductor chip of a solid-state image sensor which is one embodiment of the present invention.
Figure 2:
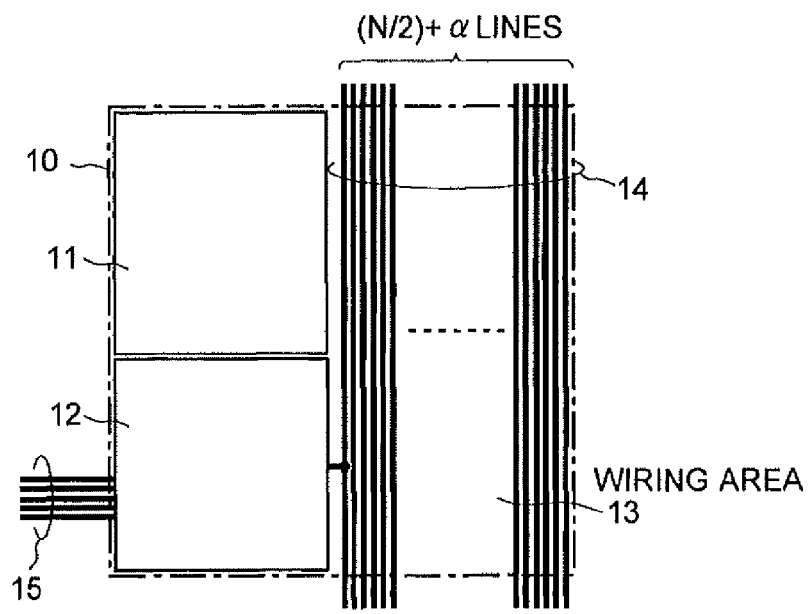
FIG. 2 is a schematic plan view showing the layout of one pixel within a pixel area in the solid-state image sensor of the present embodiment.
Figure 3:
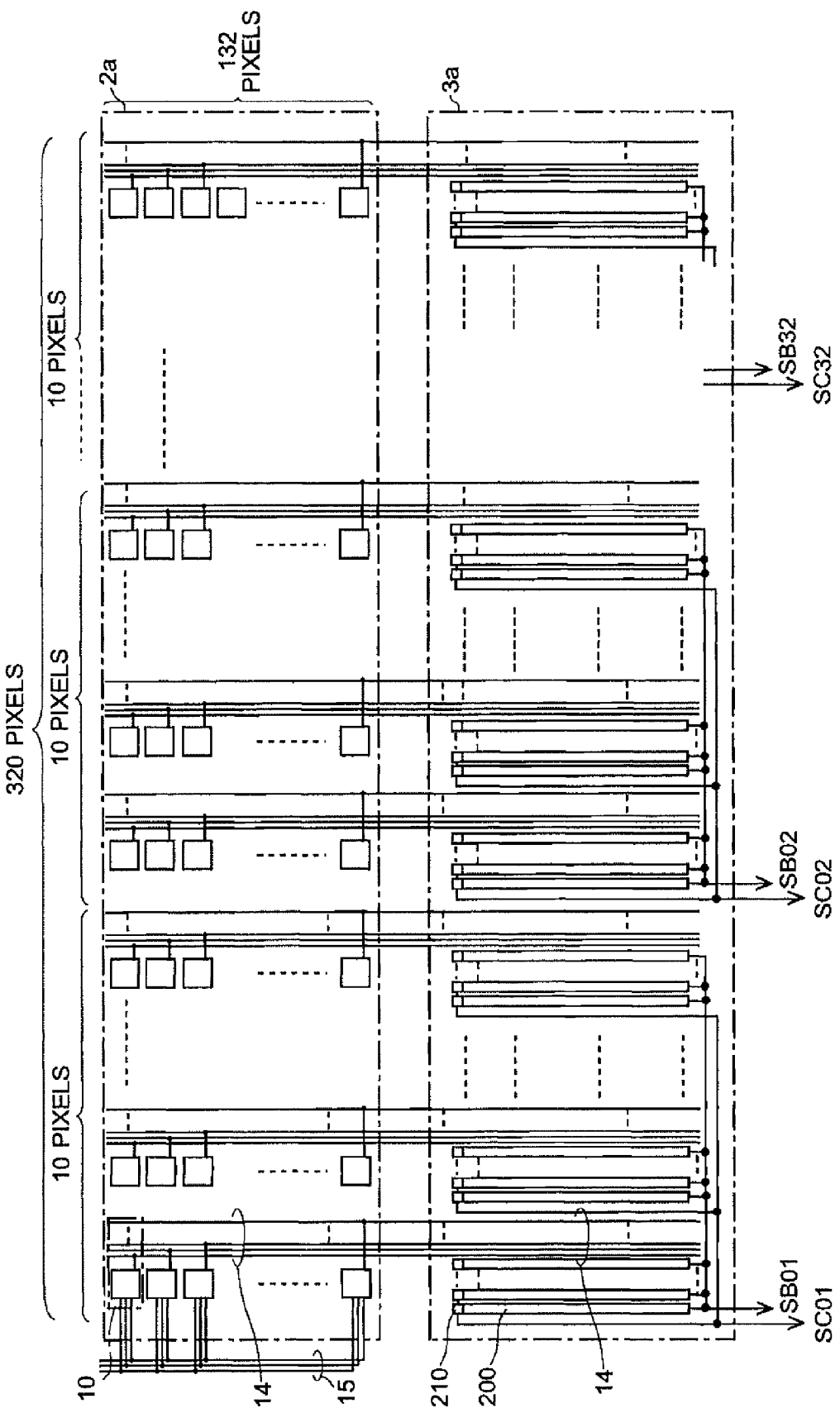
FIG. 3 is a plan view showing a schematic configuration of the pixel area and memory area in the solid-state image sensor of the present embodiment.
Figure 4:
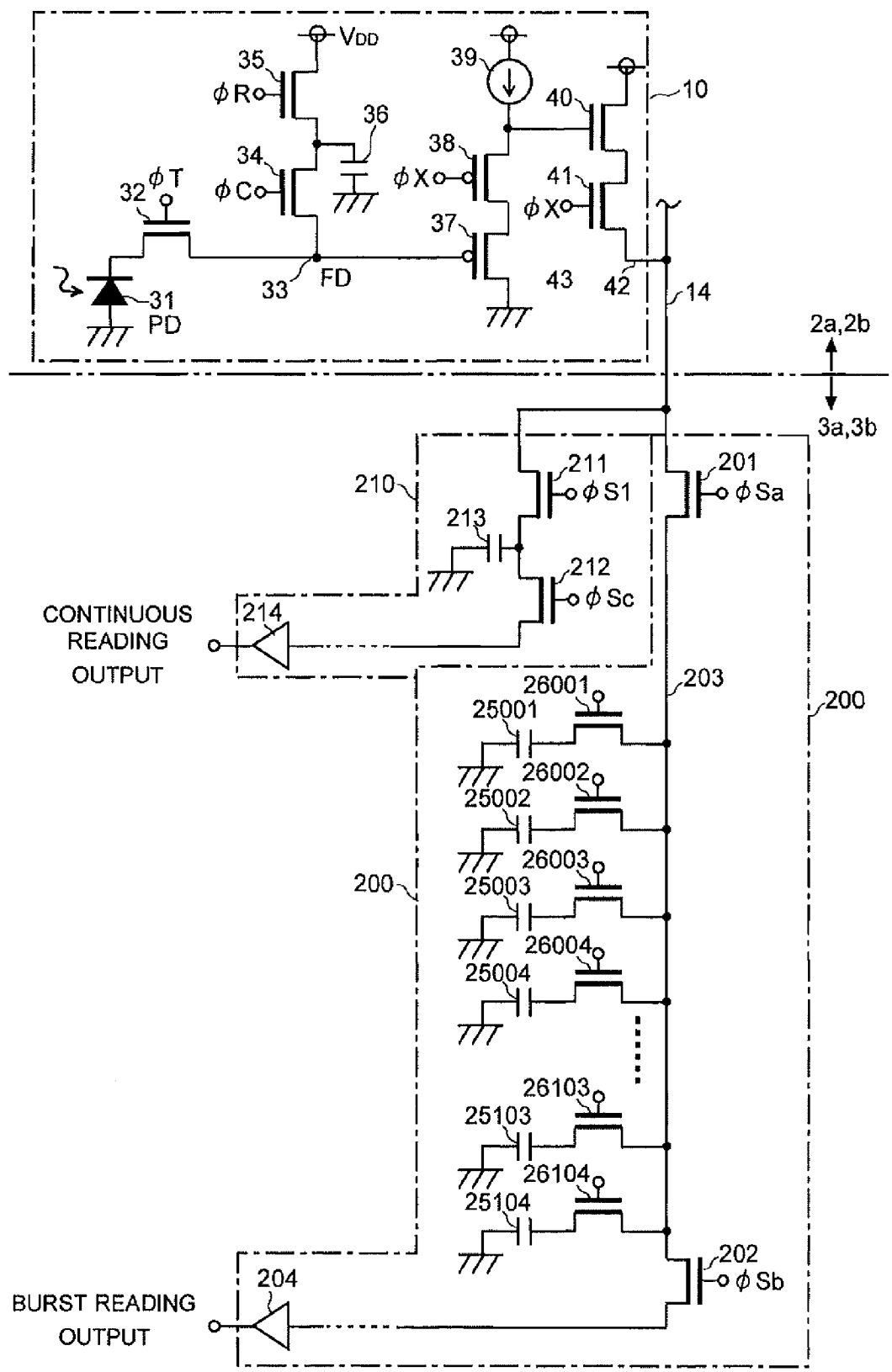
FIG. 4 is a schematic circuit configuration diagram of one pixel and a corresponding memory section in the solid-state image sensor of the present embodiment.

The overall circuit configuration and structure of the solid-state image sensor according to the present embodiment is described by means of FIGS. 1-4. FIG. 1 is a schematic plan view showing the layout on a semiconductor chip of a solid-state image sensor according to the present embodiment. FIG. 2 is a schematic plan view showing the layout of one pixel within a pixel area shown in FIG. 1. FIG. 3 is a plan view showing a schematic configuration of the pixel area and the memory area. FIG. 4 is a schematic circuit configuration diagram of one pixel and a corresponding memory section.

The solid-state image sensor includes a semiconductor substrate 1, on which a pixel area 2 for receiving incident light and producing pixel signals for each pixel as well as two memory areas 3a and 3b for holding pixel signals until they are read to the outside are provided. The pixel area 2 and the memory areas 3a and 3b are separated from each other, and each area forms a definite block. The substantially rectangular pixel area 2 has a total of N×M pixels 10, which are two-dimensionally arranged in N rows and M columns. This area 2 is further divided into a first pixel area 2a and a second pixel area 2b, each consisting of (N/2)×M pixels 10.

A first thin current source area 6a is provided between the first pixel area 2a and the first memory area 3a. Similarly, a second thin current source area 6b is provided between the second pixel area 2b and the first memory area 3b. The first memory area 3a has a first vertical scan circuit area 4a and a first horizontal scan circuit area 5a in the vicinity thereof. The first vertical scan circuit area 4a and the first horizontal scan circuit area 5a each include a circuit composed of shift registers, decoders and other elements for controlling the reading of signals from the memory sections in the first memory area 3a. The second memory area 3b similarly has a second vertical scan circuit area 4b and a second horizontal scan circuit area 5b.

The solid-state image sensor of the present embodiment is nearly symmetrical with respect to a horizontal border line extending approximately through the center of the pixel area 2 to divide this area into two sections (as indicated by the broken line in FIG. 1). The structure and operation of the upper and lower sections are basically identical. Therefore, the following description is mainly concerned with the structure and operation of the first pixel area 2a, first memory area 3a, first vertical scan circuit area 4a, first horizontal scan circuit area 5a, and first current source area 6a.

The number of pixels arranged in the pixel area 2, i.e. the values of N and M, can be arbitrarily determined. Increasing these values improves the image resolution but also unfavorably leads to either an increase in the entire chip area, or a decrease in the chip area per one pixel if the entire chip area is unchanged. In the present example, N=264 and M=320. Accordingly, the number of pixels arranged in each of the first and second pixel areas 2a and 2b is 42240, i.e. 320 pixels in the horizontal (longitudinal) direction and 132 pixels in the vertical (lateral) direction, as shown in FIG. 3.

As shown in FIG. 2, one pixel 10 occupies roughly one square area, which is further divided into three areas, i.e. the photoelectric conversion area 11, pixel circuit area 12 and wiring area 13. In the wiring area 13, a bundle of vertically extending (M/2)+α, pixel output lines 14 are provided. The value of α may be zero, in which case the number of pixel output lines 14 passing through one wiring area 13 in the present example is 132. However, when a large number of wirings (e.g. aluminum wirings or other kinds of metal wirings) parallel to each other are created in a semiconductor process, the widths of the wires at both ends as well as their parasitic capacitances normally tend to be different. To address these problems, a dummy wire, which merely forms a wiring pattern and does not transmit any signals, is additionally provided at each end of the 132 pixel output lines 14 that are used to actually pass the signals. In this case, α=2, so that the number of wires passing through one wiring area 13 is 134.

As shown in FIG. 4, each pixel 10 has a photodiode 31, transfer transistor 32, floating diffusion 33, storage transistor 34, storage capacitor 36, reset transistor 35, source follower amplifier 43, and current source 39.

The photodiode 31, which corresponds to the photoelectric conversion section of the present invention, is for receiving light and generating photocharges. The transfer transistor 32, which corresponds to the transfer element of the present invention, is for transferring the photocharges. The floating diffusion 33, which corresponds to the detection node of the present invention, is for temporarily storing the photocharges and converting them to voltage signals. The storage transistor 34 and the storage capacitor 36 are for storing electric charges overflowing from the photodiode 31 through the transfer transistor 32 during a photocharge accumulation operation. The reset transistor 35, which corresponds to the reset element of the present invention, is for discharging electric charges from the floating diffusion 33 and the storage capacitor 36. The source follower amplifier 43, which corresponds to the buffer element of the present invention, is for outputting, as voltage signals, the electric charges stored in either the floating diffusion 33 or both the floating diffusion 33 and the storage capacitor 36.

The source follower amplifier 43 has a two-stage configuration, one stage consisting of two cascade-connected PMOS transistors 37 and 38 and the other stage consisting of two cascade-connected NMOS transistors 40 and 41. The transistors 38 and 41 have the function of controlling the on/off state of the current passing through the counterpart transistors 37 and 40, respectively. The transistors 38 and 41 are hereinafter referred to as the selection transistors.

Drive lines 15 for supplying control signals φT, φC, φR and φX are respectively connected to the gate terminals of the transfer transistor 32, storage transistor 34, reset transistor 35, and selection transistors 38 and 41 (refer to FIG. 2). These drive lines are common to all the pixels 10 in the pixel area 2. By this configuration, a drive operation for accumulating photocharges or for other purposes is simultaneously performed at all the pixels 10.

The output 42 of the transistor 41 in the second stage of the source follower amplifier 43 is connected to one of the 132 pixel output lines 14 provided in the wiring area 13. The pixel output line 14 is independently provided for every pixel 10. Therefore, the present solid-state image sensor has as many pixel output lines 14 as the number of pixels, i.e. 84480.

The source follower amplifier 43 functions as a current buffer for driving the pixel output line 14 at high speeds. Each pixel output line 14 extends from the pixel area 2a to the memory area 3a and hence acts as a considerably large capacitive load. Driving such an element at high speeds requires a large-sized transistor through which high currents can be passed. On the other hand, in order to raise the photoelectric conversion gain to enhance the detection sensitivity in the pixel 10, the floating diffusion 33 for converting photocharges to voltage should preferably have the smallest possible capacitance. The parasitic capacitance of the gate terminal of the transistor 37 connected to the floating diffusion 33 causes an effective increase in the capacitance of the floating diffusion 33, Therefore, for the aforementioned reason, this transistor 37 should preferably be a small-sized transistor with a small gate-input capacitance. To fulfill both the supply of high current on the output side and the low capacitance on the input side, the source follower amplifier 43 has a two-stage configuration, where a small-sized transistor is used as the transistor 37 in the first stage to reduce the input gate capacitance while large-sized transistors are used as the second-stage transistors 40 and 41 to ensure a high output current.

The selection transistor 38 in the first stage of the source follower amplifier 43 is inessential for the basic operation and can be omitted. However, when the second-stage selection transistor 41 is off, this selection transistor 38 can be simultaneously turned off to block the current supply from the current source 39 to the transistor 37 and thereby suppress the consumption of the current.

If it is assumed that no electric charges will overflow during the process of storing photocharges via the transfer transistor 32 into the floating diffusion 33, or if such an overflow of electric charges is intentionally disregarded, it is unnecessary to provide the storage capacitor 36 and the storage transistor 34, and the floating diffusion 33 can be directly connected with the reset transistor 35.

As shown in FIG. 4, a burst reading memory section 200 and a continuous reading memory section 210 are independently provided in the first and second memory areas 3a and 3b, respectively, for each pixel 10. Not only these two memory sections but also the signal lines for reading signals from these memory sections are separated from each other.

The continuous reading memory section 210 includes a writing-side transistor 211 connected to the pixel output line 14, a reading-side transistor 212, a capacitor 213 and a buffer 214. When a signal is being provided from the pixel 10 to the pixel output line 14, the signal can be written to (held in) the capacitor 213 by turning off the reading-side transistor 212 and then turning on the writing-side transistor 211. Conversely, a signal held in the capacitor 213 can be extracted via the buffer 214 to the outside by turning off the writing-side transistor 211 and then turning on the reading-side transistor 212.

The burst reading memory section 200 includes a writing-side transistor 201 connected to the pixel output line 14, a reading-side transistor 202, sampling transistors 26001-26104 and capacitors 25001-25104 connected to a common signal line 203, as well as a buffer 204. The number of sampling transistors and capacitors equals the number L of storage frames (L=104 in the present example). When a signal is being provided from the pixel 10 to the pixel output line 14, if the reading-side transistor 202 is turned off, the writing-side transistor 201 is turned on, and any one of the sampling transistors 26001-26104 is turned on, then the signal present on the common signal line 203 can be written to (held in) one capacitor 25001-25104 connected to the sampling transistor that has been turned on. In this signal-writing operation, a series of signals corresponding to up to 104 frames of sequential images can be respectively held in the capacitors 25001-25104 by individually and sequentially turning on the sampling transistors 26001-26104.

On the other hand, while the writing-side transistor 201 is off, if the reading-side transistor 202 is turned on and then any one of the sampling transistors 26001-26104 is selectively turned on, the signal held in the capacitor 25001-25104 connected to the selected sampling transistor will be read to the common signal line 203 and sent through the buffer 204 to the outside. In this reading process, a series of signals corresponding to up to 104 frames of sequential images respectively held in the capacitors 25001-25104 can be sequentially, or serially, read by individually and sequentially turning on the sampling transistors 26001-26104.

This configuration is characterized in that the burst reading memory section 200 and the continuous reading memory section 210 are independently provided for the same pixel output line 14, the operations of the two memory sections 200 and 210 can be independently controlled, and the output signal lines for reading signals from those memory sections 200 and 210 are also independent from each other. While a signal is provided from the pixel 10 to the pixel output line 14, the same signal can be simultaneously held in one of the capacitors 25001-25104 of the burst reading memory section as well as in the single capacitor 213 of the continuous reading memory section 210 by performing the previously described signal-writing operations for both the burst reading memory section 200 and the continuous reading memory section 210. The signals that have been simultaneously held in both memory sections 200 and 210 can later be individually extracted to the outside at appropriate timings.

As shown in FIG. 3, the first memory section 3a has one burst reading memory section 200 and one continuous reading memory section 210 for each pixel 10. That is to say, there are 132 burst reading memory sections 200 and 132 continuous reading memory sections 210 respectively provided for 132 pixels 10 arranged in the vertical direction. Every ten columns of memory sections 200 and 210 arranged in the horizontal direction, each column corresponding to 132 pixels, form one group of memory sections corresponding to 1320 pixels, and the output signal lines of the memory sections 200 and 210 belonging to this group are merged into two lines, one of which is for the burst reading and the other for the continuous reading. Accordingly, there are 32 output signal lines for the burst reading and 32 output signal lines for the continuous reading extending from the first memory area 3a.

The second memory area 3b also has the same number of output signal lines extending from it. In FIG. 3, the output lines for the burst reading are denoted by SB01-SB32 and the output lines for the continuous reading are denoted by SC01-SC32.

Similar to the storage capacitor 36 in the pixel 10, all the capacitors in the memory sections 200 and 210 can be created, for example, by a double polysilicon gate structure or stack structure. Using a CCD structure to hold electric charges as in the case of the conventional IS-CCD would cause the problem that an aliasing due to dark charges caused by thermal excitation or other factors would be added to the photo signal. By contrast, a capacitor in the form of a double polysilicon gate structure or stack structure causes no such dark charges and hence no addition of aliasing, thus improving the S/N ratio of the signals to be read to the outside.

Each pair of one sampling transistor and one capacitor shown in FIG. 4, e.g. the sampling transistor 26001 and the capacitor 25001, actually consists of a plurality of sampling transistors and the same number of capacitors. As will be explained later, this configuration is intended for expanding the dynamic range and removing noises.

Drive methods and operations of the solid-state image sensor of the present embodiment are hereinafter described. The solid-state image sensor of the present embodiment has two major drive modes, i.e. a continuous reading mode and a burst reading mode. The sensor can be driven in one of these two modes. Furthermore, the two modes can be concurrently carried out. The continuous reading mode corresponds to the first drive mode of the present invention, and the burst drive mode corresponds to the second drive mode.

A schematic operation of the sensor in each of the two drive modes is hereinafter described by means of FIG. 5. FIG. 5 is a schematic time chart of the continuous reading mode, burst reading mode, and concurrent continuous/burst reading mode.

(A) Continuous Reading Mode

The basic operation of the continuous reading mode is as shown in FIG. 5(a): After photocharges for one frame are accumulated in the pixels 10 of the pixel areas 2 (2a and 2b), the signals are collectively extracted to the corresponding pixel output lines 14 at all the pixels, and then these signals are held by the capacitors 213 of the continuous reading memory sections 210. Thus, the pixel signals for one frame are completely arranged in the capacitors 213 of the continuous reading memory sections 210 in the memory areas 3a and 3b. Subsequently, horizontal shift registers and vertical shift registers are driven so as to sequentially read one frame of pixel signals in a predetermined order and send them to the outside.

The chart in FIG. 5(a) shows the timing for only one frame. The pixel areas 2a and 2b and the memory areas 3a and 3b can independently operate any time except during the period for transmitting signals through the pixel output lines 14. Accordingly, it is possible to store photocharges at the pixel areas 2a and 2b while sequentially reading signals from the memory areas 3a and 3b. Therefore, as shown in the timing chart of FIG. 5(b), the period for accumulating photocharges and the period for the sequential reading can overlap each other so that the imaging operation will be almost continuously repeated. In the case of a normal imaging operation that is not performed at high speeds, the imaging can be continued at low frame rates for a long time with the timing as shown in FIG. 5(b). The frame rate in this case is determined by the time required to sequentially read all pixel signals. That is to say, the upper limit of the frame rate is determined by the upper limit of the clock frequency for the reading operation.

(B) Burst Reading Mode

In the burst reading mode, as shown in FIG. 5(c), the following process is repeated: After the photocharges for one frame are accumulated in each pixel without performing sequential reading of the pixel signals, the signals are collectively extracted through the corresponding pixel output lines 14 at all the pixels, and then the signal charges are held by one of the capacitors 25001-25104 of the burst reading memory section 200. In this step, the signals are sequentially stored, one frame after another, into the capacitors 25001-25104 prepared for 104 frames. Then, these pixel signals corresponding to the predetermined number of frames are sequentially read and sent to the outside. The burst reading mode does not include the step of extracting signals to the outside during the imaging operation and hence is free from the limitation on the frame rate due to the upper limit of the clock frequency for the reading operation. The practically achievable maximum frame rate is mainly limited by the time required for the photocharges produced in the photodiode 31 to be collected and transferred to the floating diffusion 33, and this process requires only an extremely short period of time. Therefore, for example, it is possible to perform the continuous imaging operation at such a high frame rate that equals or even exceeds one million frames per second.

(C) Concurrent Continuous/Burst Reading Mode

The previously described continuous reading mode can also be implemented by using some of the pairs of the sampling switch and the capacitor (actually, one of those pairs) provided in the burst reading memory section 200. This means that the burst reading mode and the continuous reading mode can be selectively performed even by an image sensor having only the burst reading memory section 200. However, such a sensor cannot simultaneously perform both the burst reading mode and the continuous reading mode. By contrast, the solid-state image sensor of the present embodiment can simultaneously perform both the burst reading mode and the continuous reading mode.

In the concurrent continuous/burst reading mode, as shown FIG. 5(d), at the timing where a signal obtained by accumulating photocharges in the memory areas 2a and 2b is extracted to the pixel output line 14, the signal is simultaneously written to a capacitor in both the burst reading memory section 200 and the continuous reading memory section 210. This writing operation can be simultaneously performed at all pixels. The signal-writing operation for the capacitor 25001-25104 of the burst reading memory section 200 does not need to be simultaneous with the signal-writing operation for the capacitor 213 of the continuous reading memory section 200. For example, the signal-writing operations for the capacitors of the burst reading memory section 200 and the continuous reading memory section 210 may be sequentially performed while a pixel signal is being provided on the pixel output line 14.

When the writing-side transistor 211 in the continuous reading memory section 210 is off, the signal written to the capacitor 213 will not be influenced by any operation of the burst reading memory section 200. Accordingly, as shown in FIG. 5(d), even when the signal-writing operation in the burst reading memory section 200 is underway, the signal that has just been written to the capacitor 213 can be read to the outside by sequentially turning on the reading-side transistor 212 of the continuous reading memory section 210 corresponding to each pixel regardless of the aforementioned signal-writing operation.

On the other hand, when the writing-side transistor 201 in the burst reading memory section 200 is off, the signals written to the capacitors 25001-25104 will not be influenced by any operation of the continuous reading memory section 210. Accordingly, irrespective of whether a signal-reading or signal-writing operation in the continuous reading memory section 210 is underway, the signals that have just been written to the 104 capacitors 25001-25104 for each pixel can be sequentially read to the outside by sequentially turning on the reading-side transistor 202 of the burst reading memory section 200 corresponding to each pixel and then sequentially turning on the sampling transistors 26001-26104.

Figure 6:
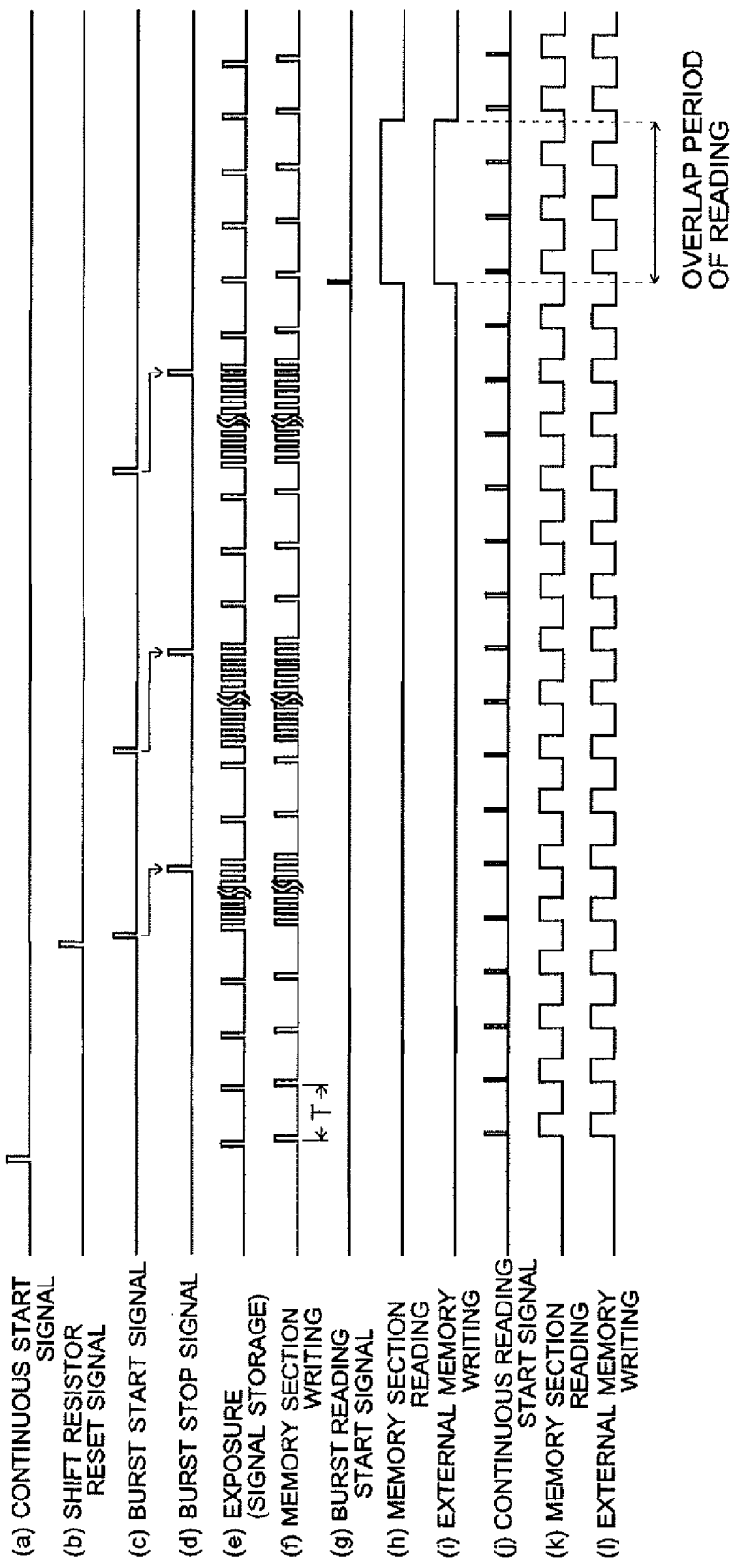
FIG. 6 is an operational timing chart of a concurrent continuous/burst reading mode in the solid-state image sensor of the present embodiment.

FIG. 6 is a more detailed version of the time chart shown in FIG. 5(d). In FIG. 6, the "continuous start signal" is a command signal for initiating the continuous reading mode, the "burst start signal" is a command signal for initiating the signal-writing operation in the burst reading mode, and the "burst stop signal" is a command signal for halting the signal-writing operation in the burst reading mode. During the period from the burst start signal to the burst stop signal, a charge-storing operation is repeated at extremely short intervals of time (refer to FIG. 6(e)), and signals based on the stored charges are written to the capacitors 25001-25104 of the burst reading memory section 200 (refer to FIG. 6(f)).

Meanwhile, the operation of writing a signal to the capacitor 213 of the continuous reading memory section 210 is also continued at a constant frame rate, i.e. at a frame rate with period T indicated in FIG. 6. After a set of signals corresponding to one frame including one signal for each pixel are written to the capacitor 213 of the continuous reading memory section 210, these signals are sequentially read in response to a continuous reading start signal shown in FIG. 6(j) within a period of time shown in FIG. 6(k). The read signals are transferred, for example, to a frame memory provided outside the sensor (which may alternatively be inside the sensor) during the period of time shown in FIG. 6(l).

The signals of up to 104 frames written to the capacitors 25001-25104 of the burst reading memory section 200 are sequentially read in response to a burst reading start signal shown in FIG. 6(g) within a period of time shown in FIG. 6(h). The read signals are transferred, for example, to a frame memory provided outside the sensor (which may alternatively be inside the sensor) during the period of time shown in FIG. 6(i). Within this period of time, as illustrated, the burst reading operation and the continuous reading operation overlap each other. However, since the output signal lines are separated, the read signals can be concurrently loaded into different external memories.

Figure 7:
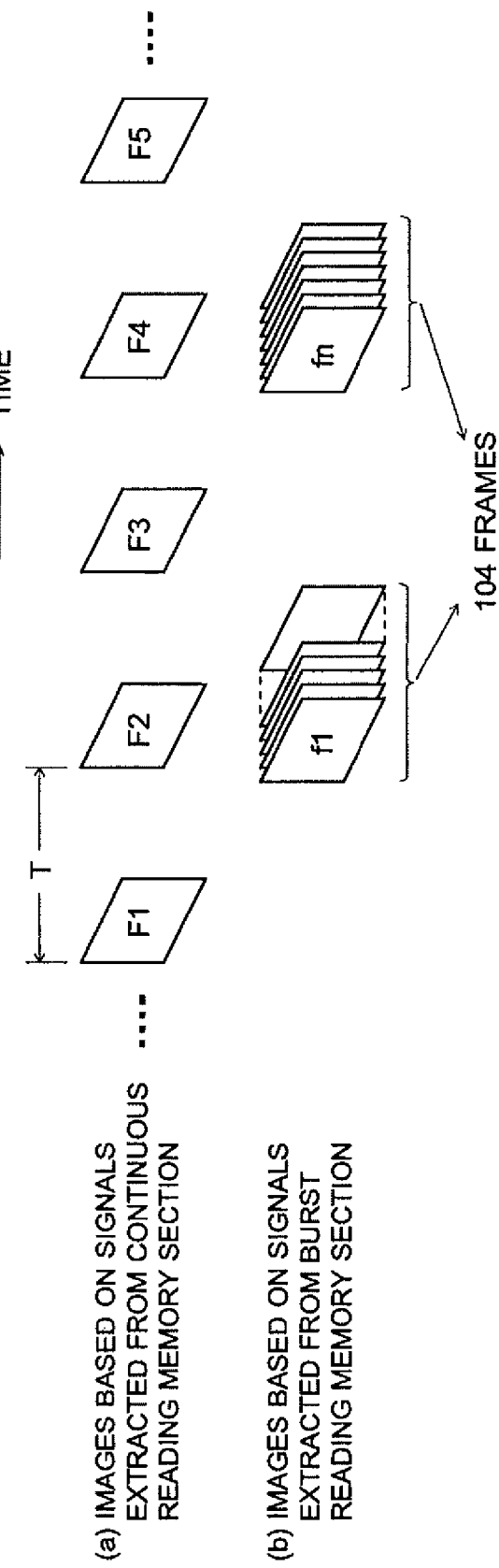
FIG. 7 is a model view of taken images based on the signals read by an operation shown in FIG. 5(d) and FIG. 6.
Figure 8:
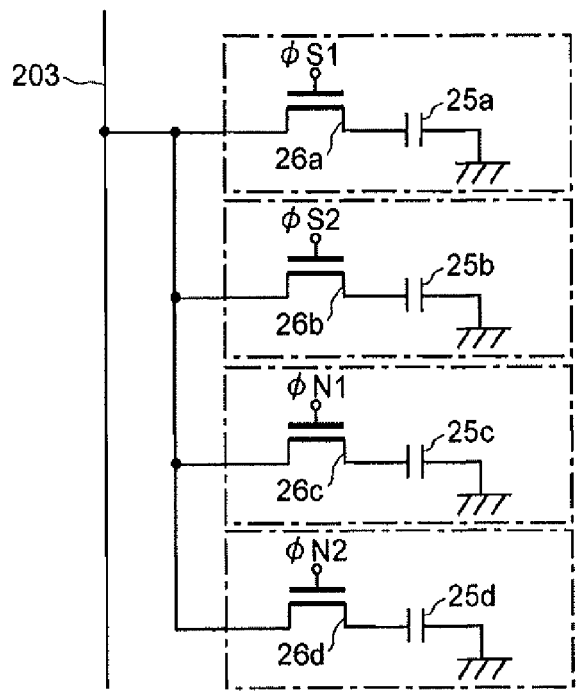
FIG. 8 is a detailed configuration diagram of a memory section for holding signals of one pixel.

FIG. 7 is a model view of taken images based on the signals read by the operations shown in FIG. 5(d) and FIG. 6. The images F1, F2, ..., which are reproduced based on the signals read from the continuous reading memory section 210, are obtained at a constant frame rate. By contrast, the images f1, f2, ..., fn, ..., f104, which are reproduced based on the signals read from the burst reading memory section 200, are obtained at extremely short intervals of time during a specific and very short period of time. None of the images obtained at the constant frame rate will be missed even during the period of time where the images f1, f2, ..., fn, ..., f104 are obtained.

As shown in FIG. 6, the period of time to perform the high-speed imaging operation can be specified by the burst start signal and the burst stop signal. Accordingly, as one example of an imaging device using a solid-state image sensor according to the present embodiment, it is possible to create an image sensor that takes images at a constant frame rate (as shown in FIG. 7(a)), processes each image to detect the beginning of a change in an object of interest or an occurrence of a phenomenon, and produces a burst start signal or burst stop signal by using the detection result. With this sensor, a high-speed imaging operation can be performed as shown in FIG. 7(b) during a period of time where a change in an object or an occurrence of a phenomenon is recognizable.

The images obtained as shown in FIG. 7(b) can also be regarded as temporally enlarged (zoomed-in) images within a specific range of time as compared to the images taken at longer intervals of time as shown in FIG. 7(a).

Thus, by means of the concurrent continuous/burst reading mode, the imaging device using the solid-state image sensor of the present embodiment provides an added value that cannot be found in any conventional high-speed imaging devices of this kind.

Though not mentioned previously for the purpose of simplifying the description, the present solid-state image sensor actually has a more complex configuration and operates in a more complex manner in order to enlarge its dynamic range and remove a noise. This point is hereinafter described.

In the memory sections 200 and 210 shown in FIG. 4, any pair of one sampling transistor and one capacitor (e.g. the sampling transistor 26001 and the capacitor 25001) consists of four sampling transistors 26a-26d and four capacitors 25a-25d, as shown in FIG. 7. That is to say, there are four capacitors to which the signal of one pixel in a given frame will be written. The original purpose of this configuration is to independently hold four kinds of signals, i.e. a signal corresponding to the charge before an overflow, a signal corresponding to the charge after an overflow, a noise signal contained in the signal corresponding to the charge before an overflow, and a noise signal contained in the signal corresponding to the charge after an overflow.

However, it is not always necessary to abide by this purpose; the capacitors 25a-25d can also be used for other purposes. For example, if the charge-accumulating operation is performed without using the storage capacitor 36 of each pixel 10, there is no need to consider the signal corresponding to the charge after an overflow and the noise signal contained in the signal corresponding to the charge after an overflow, in which case the corresponding capacitors can be used to increase the number of frames for continuous imaging. As a result, the possible number of frames for continuous imaging will be doubled to 208. If the noise removal before an overflow is also unnecessary, all the four capacitors 25a-25d can be used to hold pixel signals of each frame. Therefore, the possible number of frames for continuous imaging will be further doubled to 416.

A photoelectric conversion operation at each pixel 10 and an operation of sorting the thereby produced signals into the four capacitors 25a-25d are hereinafter described by means of FIGS. 9-12.

The solid-state image sensor of the present invention offers two different options for the drive mode: one drive mode is for a short photocharge accumulated time and the other for a relatively long photocharge accumulated time. As a rough guide, the former mode is suitable for a photocharge accumulated time shorter than a range from 10 to 100 μsec. This drive mode can be preferably used when the imaging is performed at a high rate of one million frames per second or higher, which normally means that a burst reading mode is performed.

(A) Drive Mode for Short Photocharge Accumulated Time

Figure 9:
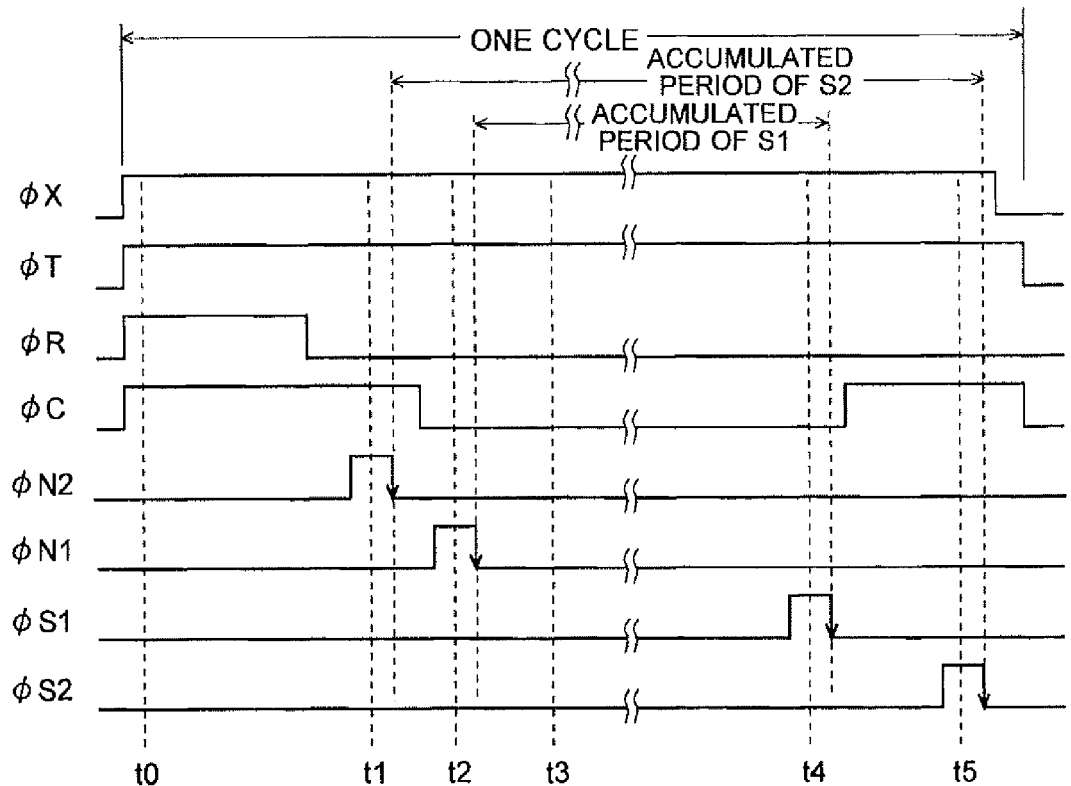
FIG. 9 is a drive timing chart of the solid-state image sensor of the present embodiment in the case where the photocharge accumulated time is short.
Figure 10:
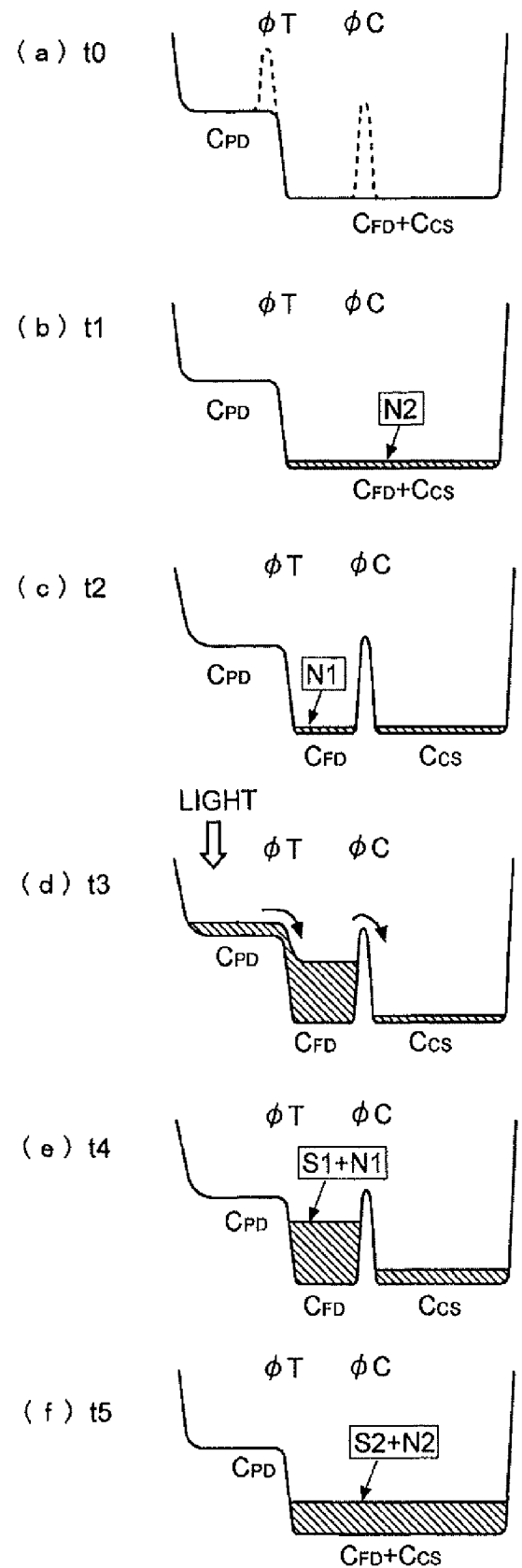
FIG. 10 is a schematic potential diagram inside a pixel during the operation shown in FIG. 9.

FIG. 9 is a drive timing chart of the operation mode for a short photocharge accumulated time, and FIG. 10 is a schematic potential diagram inside the pixel 10 during this drive mode. In FIG. 9 (and in FIG. 12, which will be mentioned later), $C_{PD}$, $C_{FD}$ and $C_{CS}$ denote the capacitances accumulated in the photodiode 31, floating diffusion 33 and storage capacitor 36, respectively, and $C_{FD}+C_{CS}$ denotes the combined capacitance of the floating diffusion 33 and storage capacitor 36.

The signal φX, which is a common control signal supplied to every pixel 10, is set to a high level to maintain both selection transistors 38 and 41 in the source follower amplifier 43 in the ON state. Before the photocharge accumulation is performed, the signals φT, φC and φR, which are also common control signals, are set to a high level to turn on the transfer transistor 32, storage transistor 34 and reset transistor 35 (time t0), whereby the floating diffusion 33 and storage capacitor 36 are reset (or initialized). At this point in time, the photodiode 31 is completely depleted. The potential at this point in time is shown in FIG. 10(a).

Next, φR is set to a low level to turn off the reset transistor 35, whereupon a noise signal N2, which equivalently contains a random noise generating in the floating diffusion 33 and storage capacitor 36 and a fixed pattern noise resulting from a variation in the threshold voltage of the transistor 37 in the source follower amplifier 43, is generated in the floating diffusion 33 (refer to FIG. 10(b)), and an output corresponding to this noise signal N2 appears in the pixel output line 141. At this timing (time t1), a sampling pulse φN2 is given to the gate terminal of the sampling transistor 26d to turn on this sampling transistor 26d, whereby the noise signal N2 outputted through the pixel output line 14 is brought into and held by the capacitor 25d.

Subsequently, φC is set to the low level to turn off the storage transistor 34, whereupon the signals stored in the floating diffusion 33 and storage capacitor 36 at this point in time are distributed to the floating diffusion 33 and the storage capacitor 36 according to the ratio of their capacitances $C_{FD}$ and $C_{CS}$ (refer to FIG. 10(c)). In this state, a noise signal N1, which contains a random noise generated when φC was turned off and a fixed pattern noise resulting from a variation in the threshold voltage of the transistor 37 in the source follower amplifier 43, is generated in the floating diffusion 33, and an output corresponding to this noise signal N1 appears in the pixel output line 14. At this timing (time t2), a sampling pulse φN1 is given to the gate terminal of the sampling transistor 26c to turn on this sampling transistor 26c, whereby the noise signal N1 outputted through the pixel output line 14 is brought into and held by the capacitor 25c.

Since the transfer transistor 32 is maintained in the ON state, the photocharges generated by light falling onto the photodiode 31 flow through the transfer transistor 32 (this state is shown in FIG. 7(b)) into the floating diffusion 33, and are accumulated in the floating diffusion 33, being superimposed on the noise signal N1 (time t3). If the floating diffusion 33 is saturated due to a large amount of photocharges produced in the photodiode 31 by strong incident light, the overflowing charges are accumulated through the storage transistor 34 into the storage capacitor 36 (refer to FIG. 10(d)). Setting the threshold voltage of the storage transistor 34 at an appropriately low level enables those charges to be efficiently transferred from the floating diffusion 33 to the storage capacitor 36. By this method, it is possible to effectively utilize the saturated charges without discarding them even if the floating diffusion 33 has a small capacitance $C_{FD}$ and can store only a small amount of charges in the maximally saturated state. In this manner, both the charges produced before charge saturation (overflow) at the floating diffusion 33 and those produced after charge saturation (overflow) can be reflected in the output.

After a predetermined photocharge accumulated time (exposure time) has elapsed, a sampling pulse φS1 is given to the gate terminal of the sampling transistor 26a, with the storage transistor 34 in the OFF state, to turn on the sampling transistor 26a, whereby a signal corresponding to the charge accumulated in the floating diffusion 33 at that point in time (time t4) is extracted through the pixel output line 14 and held in the capacitor 25a (refer to FIG. 10(e)). The signal accumulated in the floating diffusion 33 at this point in time results from the superposition of a noise signal N1 and a signal S1 corresponding to the charge before an overflow. Accordingly, the signal held in the capacitor 25a equals S1+N1, which does not reflect the amount of charge accumulated in the storage capacitor 36.

Immediately after that, φC is set to the high level to turn on the storage transistor 34, whereupon the charge held in the floating diffusion 33 at that point in time is mixed with the charge held in the storage capacitor 36 (refer to FIG. 10(f)). In this state, a sampling pulse φS2 is given to the gate terminal of the sampling transistor 26b to turn on this sampling transistor 26b (time t5), whereby a signal corresponding to the charges held in the floating diffusion 33 and the storage capacitor 36, i.e. a signal resulting from the superposition of the noise signal N2 and the signal S2 corresponding to the charge after the overflow, is extracted through the pixel output line 14 and held in the capacitor 25b. Accordingly, the signal to be held in the capacitor 25b is S2+N2, which reflects the amount of charge accumulated in the storage capacitor 36.

By the process described thus far, the signals S1+N1, S2+N2, N1 and N2 are respectively held in the four capacitors 25a, 25b, 25e and 25d. Thus, one cycle of the image signal acquisition operation is completed. As already explained, the noise signals N1 and N2 containing the random noise and fixed pattern noise are obtained separately from the other signals containing these noise signals. These signals can be respectively read from the capacitors 25a, 25b, 25c and 25d and then subjected to a subtracting operation by an analogue computing circuit (not shown) to obtain high S/N image signals free from the influence of the noise signals N1 and N2. Since the charges that have overflowed from the floating diffusion 33 are not discarded but utilized, even a strong incident light barely causes saturation, so that a signal reflecting the strong light can be obtained. Thus, a wide dynamic range is ensured. The possibilities of widening the dynamic range in this manner are described in detail in the Japanese Unexamined Patent Application Publication No. 2006-245522 and other documents. Therefore, no explanation will be made in this specification.

(B) Operation Mode for Relatively Long Photocharge Accumulated Time

Figure 11:
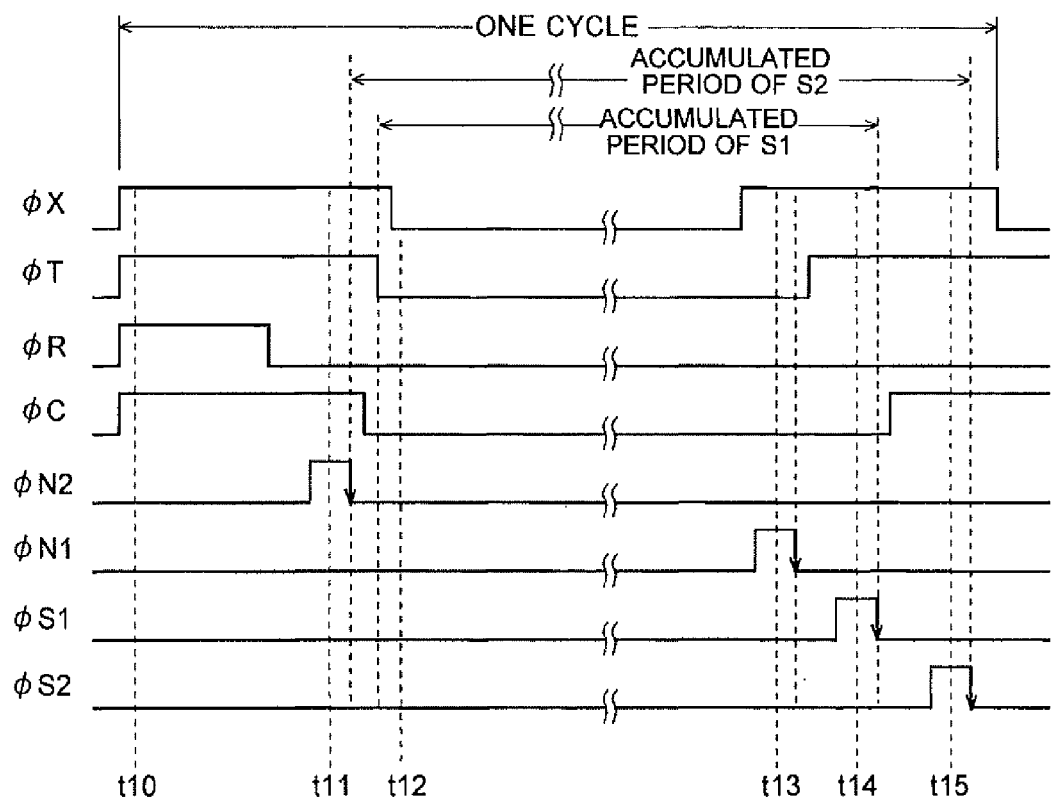
FIG. 11 is a drive timing chart of the solid-state image sensor of the present embodiment in the case where the photocharge accumulated time is long.
Figure 12:
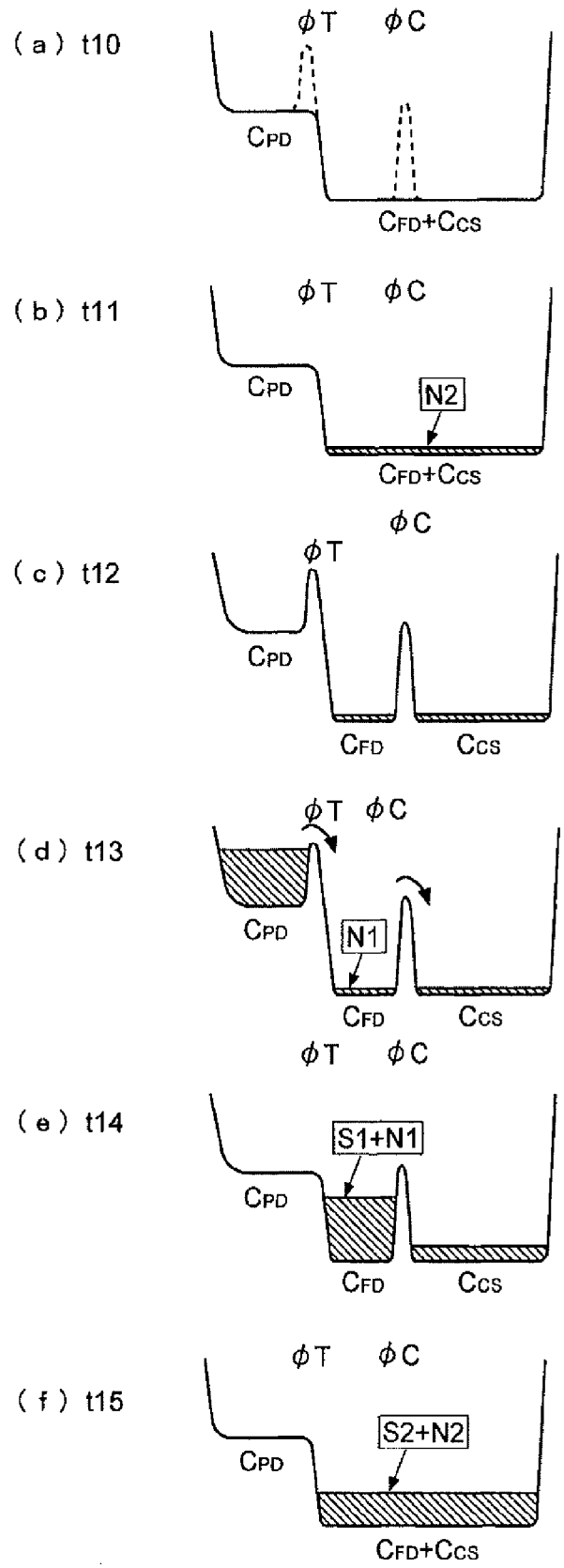
FIG. 12 is a schematic potential diagram inside a pixel during the operation shown in FIG. 11.

An operation for a relatively long photocharge accumulated time is hereinafter described. FIG. 11 is a drive timing chart in the case where the photocharge accumulated time is relatively long, and FIG. 12 is a schematic potential diagram inside the pixel in this operation.

The most significant difference from the case of the short photocharge accumulated time exists in that the transfer transistor 32 is turned off during the photocharge accumulated period so that the photocharges produced in the photodiode 31 will be accumulated in a depletion layer. Another difference is that, taking into account the long photocharge accumulated time, the selection transistors 38 and 41 of the source follower amplifier 43 are turned off for a predetermined period of time in order to reduce power consumption.

Before the photocharge accumulated is performed, φT, φC and φR are set to high levels to turn on the transfer transistor 32, storage transistor 34 and reset transistor 35 (time t10), whereby the floating diffusion 33 and storage capacitor 36 are reset (or initialized). At this point in time, the photodiode 31 is completely depleted. The state of potential at this point in time is shown in FIG. 12(a).

Next, φR is set to the low level to turn off the reset transistor 35, whereupon a noise signal N2, which equivalently contains a random noise generating in the floating diffusion 33 and the storage capacitor 36 and a fixed pattern noise resulting from a variation in the threshold voltage of the transistor 37 in the source follower amplifier 43, is generated in the floating diffusion 33 (refer to FIG. 12(b)), and an output corresponding to this noise signal N2 appears in the pixel output line 14. At this timing (time t11), a sampling pulse φN2 is given to the gate terminal of the sampling transistor 26d to turn on this sampling transistor 26d, whereby the noise signal N2 is extracted through the pixel output line 14 and held in the capacitor 25d. The operations to this point are identical to those of the previously described operation mode for a short photocharge accumulated time.

Next, φC is set to the low level to turn off the storage transistor 34, whereupon the signals accumulated in the floating diffusion 33 and storage capacitor 36 at this point in time are distributed to the floating diffusion 33 and storage capacitor 36 according to the ratio of their capacitances $C_{FD}$ and $C_{CS}$. Furthermore, φT is set to the low level to turn off the transfer transistor 32, and φX is also set to the low level to turn off the two selection transistors 38 and 41 of the source follower amplifier 43 (time t12). As a result, a potential barrier is formed between the photodiode 31 and the floating diffusion 33, creating a condition where photocharges can be accumulated in the photodiode 31 (refer to FIG. 12(c)).

The photocharges produced by incident light falling onto the photodiode 31 are accumulated in the photodiode 31. When a charge saturation occurs in the photodiode 31, excessive charges overflow through the transfer transistor 32, to be accumulated in the floating diffusion 33 and superimposed on the noise signal that has been distributed as described previously. If the floating diffusion 33 is saturated by stronger incident light, the overflowing charges will be accumulated through the storage transistor 34 into the storage capacitor 36 (refer to FIG. 12(d)).

Setting the threshold voltage of the storage transistor 34 at a level appropriately lower than that of the transfer transistor 32 enables the charges saturated in the floating diffusion 33 to be efficiently transferred from the floating diffusion 33 to the storage capacitor 36 without being returned to the photodiode 31. By this method, it is possible to effectively use the saturated charges without discarding them even if the floating diffusion 33 has a small capacitance $C_{FD}$ and can store only a small amount of charges. In this manner, both the charges produced before the overflow at the floating diffusion 33 and those produced after the overflow can be reflected in the output.

After a predetermined photocharge accumulated time has elapsed, φX is set to the high level to turn on the selection transistors 38 and 41, after which a sampling pulse φN1 is given to the gate terminal of the sampling transistor 26c to turn on this sampling transistor 26c, whereby a noise signal N1 corresponding to the signal charge accumulated in the floating diffusion 33 at this point in time (time t13) is extracted through the pixel output line 14 and held in the capacitor 25c. The noise signal N1 at this point in time contains a fixed pattern noise due to a variation in the threshold voltage of the transistor 37 in the source follower amplifier 43. It should be noted that this signal contains not only the noise but also a portion of the photocharges produced by photoelectric conversion, which are also regarded as a type of noise in the present case.

Next, φT is set to the high level to turn on the transfer transistor 32, whereupon the photocharges accumulated in the photodiode 31 are completely transferred to the floating diffusion 33 (refer to FIG. 12(e)). Immediately after that (time t14), a sampling pulse φS1 is given to the gate terminal of the sampling transistor 26a to turn on this sampling transistor 26a, whereby a signal corresponding to the charge accumulated in the floating diffusion 33 is extracted through the pixel output line 14 and held in the capacitor 25a. This signal results from the superposition of the aforementioned noise signal N1 and the signal corresponding to the charge accumulated in the photodiode 31, i.e. the signal S1 before the overflow, and hence equals S1+N1.

Subsequently, φC is set to the high level to turn on the storage transistor 34, whereupon the charge held in the floating diffusion 33 at that point in time is mixed with the charge held in the storage capacitor 36 (refer to FIG. 12(f)). In this state, a sampling pulse φS2 is given to the gate terminal of the sampling transistor 26b to turn on this sampling transistor 26b (time t15), whereby a signal corresponding to the charges held in the floating diffusion 33 and storage capacitor 36 are extracted through the pixel output line 14 and held in the capacitor 25b. This signal equals S2+N2.

By the process described thus far, the signals S1+N1, S2+N2, N1 and N2 are respectively held in the four capacitors 25a, 25b, 25c and 25d. Thus, one cycle of image signal acquisition is completed. As in the case of the operation mode for the short photocharge accumulated time, the noise signals N1 and N2 containing the random noise and fixed pattern noise are obtained separately from the other signals containing these noise signals. These signals can be respectively read from the capacitors 25a, 25b, 25c and 25d and then subjected to subtraction or other analogue computing to obtain high S/N image signals free from the influence of the noise signals N1 and N2. Since the charges that have overflowed from the floating diffusion 33 are not discarded but utilized, even a strong incident light barely causes saturation, so that a signal reflecting the strong light can be obtained. Thus, a wide dynamic range is ensured.

As described previously, the control signals φX, φT, φR and φC supplied to each pixel 10 are common to all the pixels. Therefore, the aforementioned operations of accumulating photocharges and transferring signals from each pixel 10 to the memory sections 200 and 210 are simultaneously performed at all the pixels 10. That is to say, by one cycle of these operations, one frame of image signals is held in the memory sections 200 and 210. In the burst reading mode, the operations are repeated 104 times to store image signals in all the capacitors 25001-25104 in the burst reading memory section 200. In the 105$^{th}$ and subsequent cycles, the signal-writing operation is once more initiated from the uppermost capacitor 25001 in the burst reading memory section 200. Thus, the signal-holding operation is carried out cyclically. This process is continued, for example, until a command signal for halting the imaging is externally given. When the command signal for halting the imaging is given and the imaging is thereby discontinued, the latest 104 frames of image signals are held in the memory areas 3a and 3b. By sequentially reading these signals, a series of image signals corresponding to 104 frames can be obtained.

When, as described previously, new signals are to be held in the capacitors of the memory sections 200 and 201 in which some signals are already present, it is necessary to reset the capacitors in order to discard those older signals. For this purpose, though not shown in the figures, a transistor for resetting is connected to each pixel output line 14. To reset the capacitor of a given memory section 200 or 201, the sampling transistor of the memory section is turned on and, simultaneously, the transistor for resetting connected to the corresponding pixel output line is turned on, whereby the signal accumulated in the capacitor is reset through the sampling transistor and the pixel output line. After this resetting operation is performed, a new signal is held in the capacitor.

It should be noted that the foregoing embodiments are mere examples of the solid-state image sensor and its drive method according to the present invention; any change, modification or addition that is appropriately made within the spirit of the present invention naturally falls within the scope of the claims of the present patent application.

EXPLANATION OF NUMERALS

1 . . . Semiconductor Substrate
10 . . . Pixel
11 . . . Photoelectric Conversion Area
12 . . . Pixel Circuit Area
13 . . . Wiring Area
14 . . . Pixel Output Line
15 . . . Drive Line
2, 2a, 2b . . . Pixel Area
3a, 3b . . . Memory Area
200 . . . Burst Reading Memory Section
201, 211 . . . Writing-Side Transistor
202, 212 . . . Reading-Side Transistor
203 . . . Common Signal Line
204, 214 . . . Buffer
210 . . . Continuous Reading Memory Section
213, 25001-25104, 25a-25d . . . Capacitor
26001-26104, 26a-26d . . . Sampling Transistor
31 . . . Photodiode
32 . . . Transfer Transistor
33 . . . Floating Diffusion
34 . . . Storage Transistor
35 . . . Reset Transistor
36 . . . Storage Capacitor
37, 40 . . . Transistor
38, 41 . . . Selection Transistor
39 . . . Current Source
42 . . . Output
43 . . . Source Follower Amplifier
4a, 4b . . . Vertical Scan Circuit Area
5a, 5b . . . Horizontal Scan Circuit Area
6a, 6b . . . Current Source Area

The invention claimed is:

1. A solid-state image sensor, comprising:
a pixel area in which a plurality of pixels each including a photoelectric conversion section for receiving light and producing photocharges are arranged in a two-dimensional array; and
a memory area, which is an area separated from the pixel area and in which a burst reading memory section and continuous reading memory section are arranged for each pixel,
the burst reading memory section having memory sections such that each pixel is connected to its own plurality of memory sections in the burst reading memory section, the plurality of the memory sections being provided to hold output signals of one pixel in the pixel area for a plurality of frames without being read to an outside of the memory area, and
separately from the burst reading memory section, the continuous reading memory section having memory sections such that each pixel is connected to its own one memory section in the continuous reading memory section, and in which an output signal line for reading signals held in the burst reading memory section and an output signal line for reading a signal held in the continuous reading memory section are independently provided.

2. The solid-state image sensor according to claim 1, wherein each pixel further includes:
a transfer element for transferring photocharges produced in the photoelectric conversion section to a detection node for converting an electric-charge signal to a voltage signal;
a buffer element for sending an output signal from the detection node to a pixel output line; and
a reset element for resetting at least the photoelectric conversion section and the detection node.

3. A solid-state image sensor comprising:
a pixel area in which a plurality of pixels each including a photoelectric conversion section for receiving light and producing photocharges are arranged in a two-dimensional array;
a memory area, which is an area separated from the pixel area and in which a burst reading memory section and continuous reading memory section are arranged for each pixel, the burst reading memory section including a plurality of memory sections for each pixel so that output signals of one pixel in the pixel area can be held for a plurality of frames without being read to the outside, and the continuous reading memory section including each one memory section for each pixel separately from the burst reading memory section, and in which an output signal line for reading signals held in the burst reading memory section and an output signal line for reading a signal held in the continuous reading memory section are independently provided; and
a drive control section for driving the pixels, the burst reading memory sections and the continuous reading memory sections and for performing:
a first drive mode, in which an operation of accumulating photocharges in each pixel and an operation of holding a signal read from each pixel in each corresponding continuous reading memory section are performed simultaneously at all the pixels and, subsequently, the signals corresponding to one frame are outputted by sequentially reading the signals held in the continuous reading memory sections; and
a second drive mode, in which the operation of accumulating photocharges in each pixel and an operation of holding a signal read from each pixel in one of said plurality of memory sections of each corresponding burst reading memory section are performed simultaneously at all the pixels and repeated while changing the memory section to hold the signal read from each pixel from one to another among said plurality of memory sections in each burst reading memory section sequentially, and after the signals corresponding to a plurality of frames are held in the burst reading memory sections, the signals corresponding to the plurality of frames are outputted by sequentially reading signals from the burst reading memory sections.

4. The solid-state image sensor according to claim 3, wherein the drive control section concurrently performs both the first drive mode and the second drive mode so as to simultaneously hold each signal read from each pixel in one of said plurality of memory sections of each corresponding burst reading memory section as well as in each corresponding continuous reading memory section.

5. A method for driving the solid-state image sensor comprising:
providing a pixel area in which a plurality of pixels each including a photoelectric conversion section for receiving light and producing photocharges are arranged in a two-dimensional array;
providing a memory area, which is an area separated from the pixel area and in which a burst reading memory section and continuous reading memory section are arranged for each pixel, the burst reading memory section including a plurality of memory sections for each pixel so that output signals of one pixel in the pixel area can be held for a plurality of frames without being read to the outside, and the continuous reading memory section including each one memory section for each pixel separately from the burst reading memory section, and in which an output signal line for reading signals held in the burst reading memory section and an output signal line for reading a signal held in the continuous reading memory section are independently provided;
providing a first drive mode, in which an operation of accumulating photocharges in each pixel and an operation of holding a signal read from each pixel in each corresponding continuous reading memory section are performed simultaneously at all the pixels and, subsequently, the signals corresponding to one frame are outputted by sequentially reading the signals held in the continuous reading memory sections; and
providing a second drive mode, in which the operation of accumulating photocharges in each pixel and an operation of holding a signal read from each pixel in one of said plurality of memory sections of each corresponding burst reading memory section are performed simultaneously at all the pixels and repeated while changing the memory section to hold the signal read from each pixel from one to another among said plurality of memory sections in each burst reading memory section sequentially, and after the signals corresponding to a plurality of frames are held in the burst reading memory sections, the signals corresponding to the plurality of frames are outputted by sequentially reading signals from the burst reading memory sections, and the method including concurrently performing both the first drive mode and the second drive mode so as to simultaneously hold each signal read from each pixel in one of said plurality of memory sections of each corresponding burst reading memory section as well as in each corresponding continuous reading memory section.

6. The method for driving a solid-state image sensor according to claim 5, comprising operating the solid-state image sensor in the first drive mode, generating a trigger signal upon capturing an occurrence of a phenomenon of interest or a change in an object based on a signal generated by the solid-state image sensor, and changing the drive mode according to the trigger signal so as to concurrently perform the first drive mode and the second drive mode.

7. The solid-state image sensor according to claim 2, further comprising a drive control section for driving the pixels, the burst reading memory sections and the continuous reading memory sections and for performing:
a first drive mode, in which an operation of accumulating photocharges in each pixel and an operation of holding a signal read from each pixel in each corresponding continuous reading memory section are performed simultaneously at all the pixels and, subsequently, the signals corresponding to one frame are outputted by sequentially reading the signals held in the continuous reading memory sections; and a second drive mode, in which the operation of accumulating photocharges in each pixel and an operation of holding a signal read from each pixel in one of said plurality of memory sections of each corresponding burst reading memory section are performed simultaneously at all the pixels and repeated while changing the memory section to hold the signal read from each pixel from one to another among said plurality of memory sections in each burst reading memory section sequentially, and after the signals corresponding to a plurality of frames are held in the burst reading memory sections, the signals corresponding to the plurality of frames are outputted by sequentially reading signals from the burst reading memory sections.

8. The solid-state image sensor according to claim 7, wherein the drive control section concurrently performs both the first drive mode and the second drive mode so as to simultaneously hold each signal read from each pixel in one of said plurality of memory sections of each corresponding burst reading memory section as well as in each corresponding continuous reading memory section.

9. The solid-state image sensor according to claim 1, wherein holding a signal in the continuous reading memory section is performed simultaneously at all the pixels and/or holding a signal in one of the plurality of memory sections of the burst reading memory section is performed simultaneously at all the pixels.

10. The solid-state image sensor according to claim 1, wherein signals respectively from all the pixels are held simultaneously in the burst reading memory section, or signals respectively from all the pixels are held simultaneously in the continuous reading memory section, or signals respectively from all the pixels are held simultaneously in the burst reading memory section and the continuous reading memory section.

* * * * *